United States Patent
Saito

(10) Patent No.: US 9,140,991 B2
(45) Date of Patent: Sep. 22, 2015

(54) ILLUMINATION OPTICAL SYSTEM, EXPOSURE APPARATUS, AND DEVICE MANUFACTURING METHOD

(71) Applicant: CANON KABUSHIKI KAISHA, Tokyo (JP)

(72) Inventor: Nobuyuki Saito, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 305 days.

(21) Appl. No.: 13/832,706

(22) Filed: Mar. 15, 2013

(65) Prior Publication Data

US 2013/0265559 A1    Oct. 10, 2013

(30) Foreign Application Priority Data

Apr. 5, 2012   (JP) .................................. 2012-086851

(51) Int. Cl.
| | | |
|---|---|---|
| G03B 27/54 | (2006.01) | |
| G03B 27/72 | (2006.01) | |
| G03F 7/20 | (2006.01) | |

(52) U.S. Cl.
CPC .......... *G03F 7/70133* (2013.01); *G03F 7/7055* (2013.01); *G03F 7/70058* (2013.01); *G03F 7/70066* (2013.01)

(58) Field of Classification Search
CPC ............ G03F 7/70058; G03F 7/70066; G03F 7/70083; G03F 7/70133; G03F 7/7055
USPC ......... 355/53, 67, 68, 71, 77; 359/232; 430/5, 430/30
See application file for complete search history.

(56) References Cited

U.S. PATENT DOCUMENTS

2005/0179881 A1   8/2005  Kohno

FOREIGN PATENT DOCUMENTS

| JP | 08241860 A | 9/1996 |
|----|---|---|
| JP | 2000243681 A | 9/2000 |
| JP | 2000252193 A | 9/2000 |
| KR | 1020060041861 A | 5/2006 |

OTHER PUBLICATIONS

Office Action issued in KR10-2013-0036122, mailed Jul. 23, 2015.

*Primary Examiner* — Colin Kreutzer
(74) *Attorney, Agent, or Firm* — Rossi, Kimms & McDowell LLP

(57) ABSTRACT

An illumination optical system includes: a stop configured to define an illumination range of a surface to be illuminated; an imaging optical system configured to form an image of an aperture of the stop onto the surface to be illuminated; an calculation unit configured to calculate an offset amount between a size of the aperture and a target illumination range of the surface to be illuminated using data on the target illumination range; and an adjusting unit configured to adjust the size of the aperture based on the calculated offset amount. The offset amount differs according to a size of the target illumination range.

13 Claims, 9 Drawing Sheets

F I G. 2
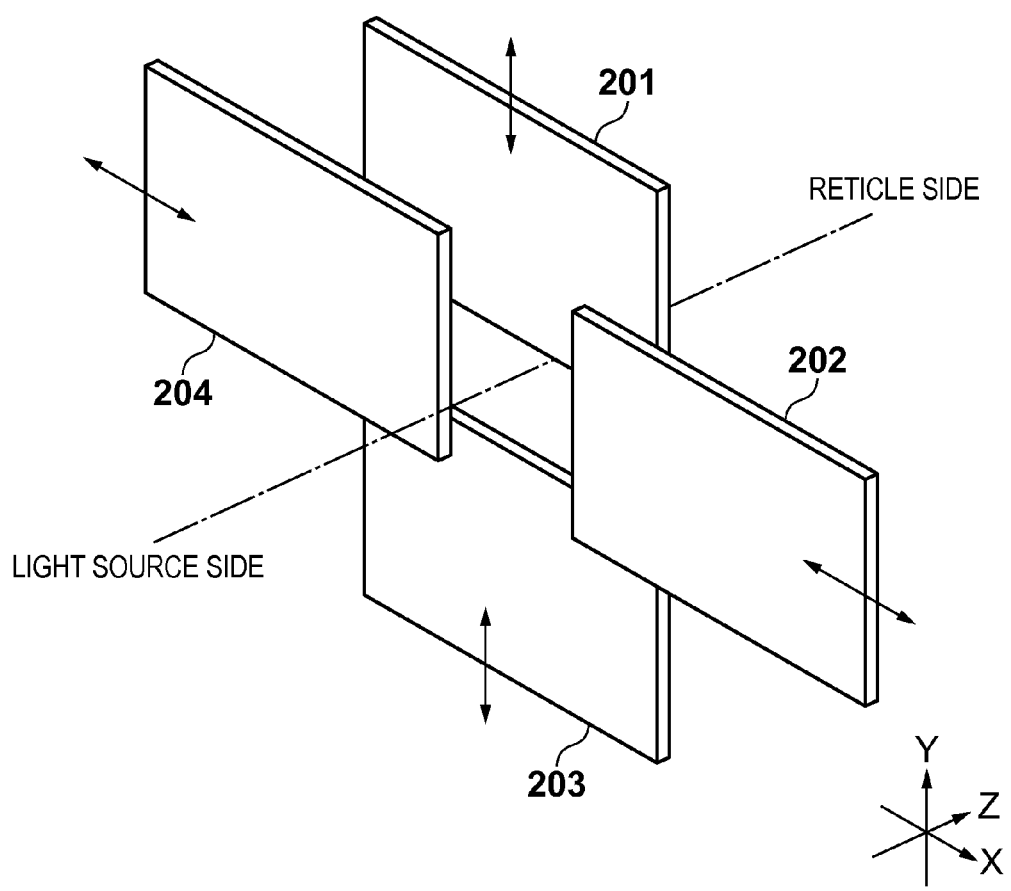

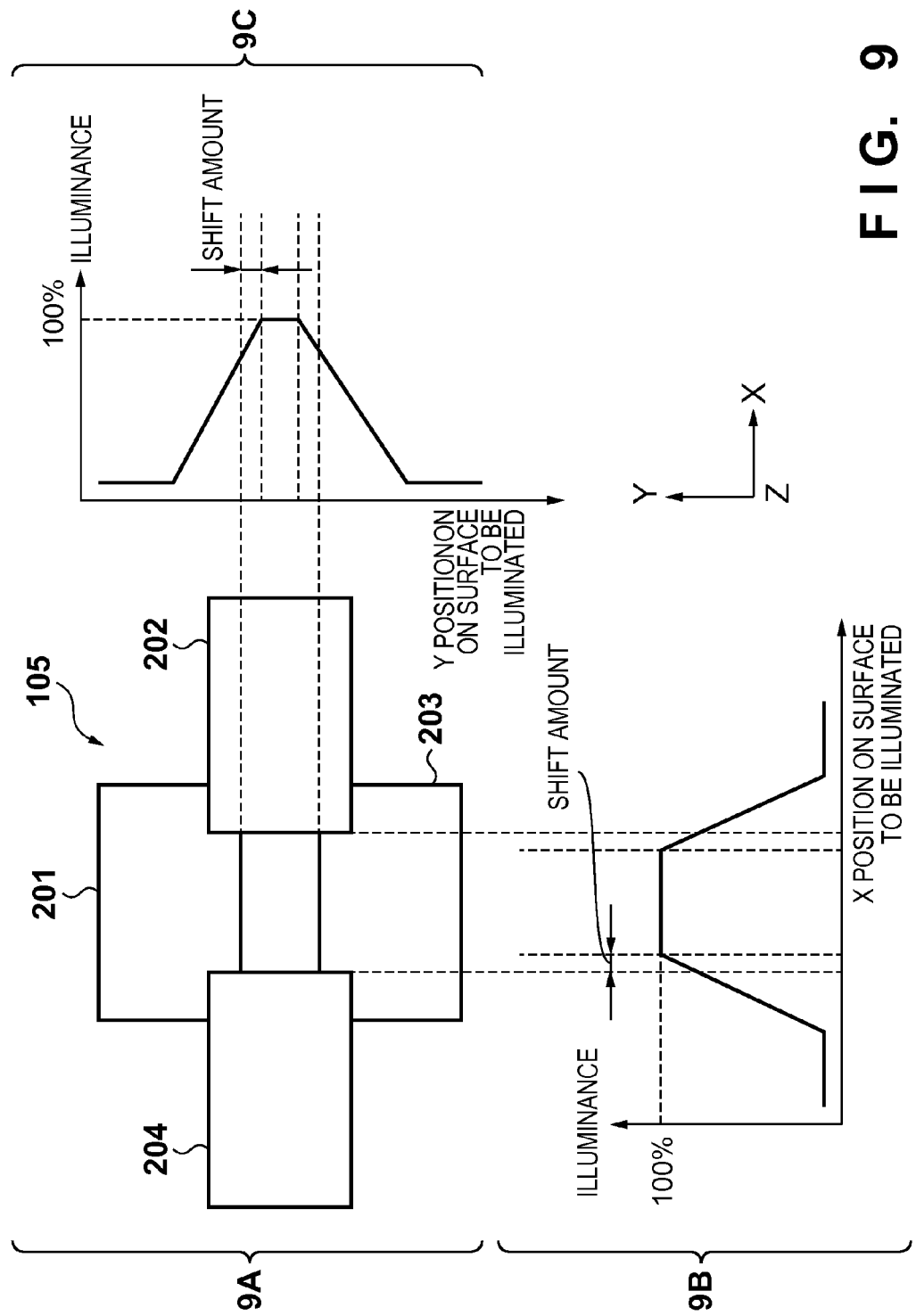

ILLUMINATION OPTICAL SYSTEM, EXPOSURE APPARATUS, AND DEVICE MANUFACTURING METHOD

BACKGROUND OF THE INVENTION

1. Field of the Invention

The present invention relates to an illumination optical system, exposure apparatus, and device manufacturing method.

2. Description of the Related Art

Generally when performing an exposure process, the illumination range of a reticle is restricted by an illumination field stop formed in an illumination optical system so that no light hits an unwanted range of a reticle or mask serving as a circuit original. However, when the illumination range is controlled to execute an exposure process, the image of the illumination field stop blurs owing to aberration of an optical system which forms the image of the illumination field stop onto a reticle. As a result, the exposure amount decreases near a light shielding portion. The decrease in exposure amount is therefore prevented by offsetting the illumination field stop in the opening direction with respect to a target illumination range. Japanese Patent Laid-Open No. 2000-252193 discloses a technique of setting a light shielding band around a reticle pattern and widening the illumination field stop in the opening direction by ½ of the light shielding band width.

In a conventional exposure apparatus, the illumination field stop is widened in the opening direction by a predetermined offset amount regardless of the illumination range. However, the blur amount changes or the image forming position shifts depending on the illumination range owing to aberration of the optical system which forms the image of the illumination field stop onto a reticle. If the illumination range of the illumination field stop is changed to perform exposure, the offset amount becomes short, an image blurs in a predetermined illumination range, and the exposure amount decreases.

SUMMARY OF THE INVENTION

The present invention provides an illumination optical system in which the exposure amount does not decrease in a target illumination range.

The present invention in its first aspect provide an illumination optical system comprising: a stop configured to define an illumination range of a surface to be illuminated; an imaging optical system configured to form an image of an aperture of the stop onto the surface to be illuminated; an calculation unit configured to calculate an offset amount between a size of the aperture and a target illumination range of the surface to be illuminated using data on the target illumination range of the surface to be illuminated; and an adjusting unit configured to adjust the size of the aperture based on the calculated offset amount, wherein the offset amount differs according to a size of the target illumination range of the surface to be illuminated.

Further features of the present invention will become apparent from the following description of exemplary embodiments with reference to the attached drawings.

BRIEF DESCRIPTION OF THE DRAWINGS

FIG. 2 is a view showing an illumination field stop;

FIG. 9 is a view showing a method of obtaining an offset amount in the fourth embodiment.

DESCRIPTION OF THE EMBODIMENTS

Embodiments of the present invention will now be described in detail with reference to the accompanying drawings.

First Embodiment

Figure 1:
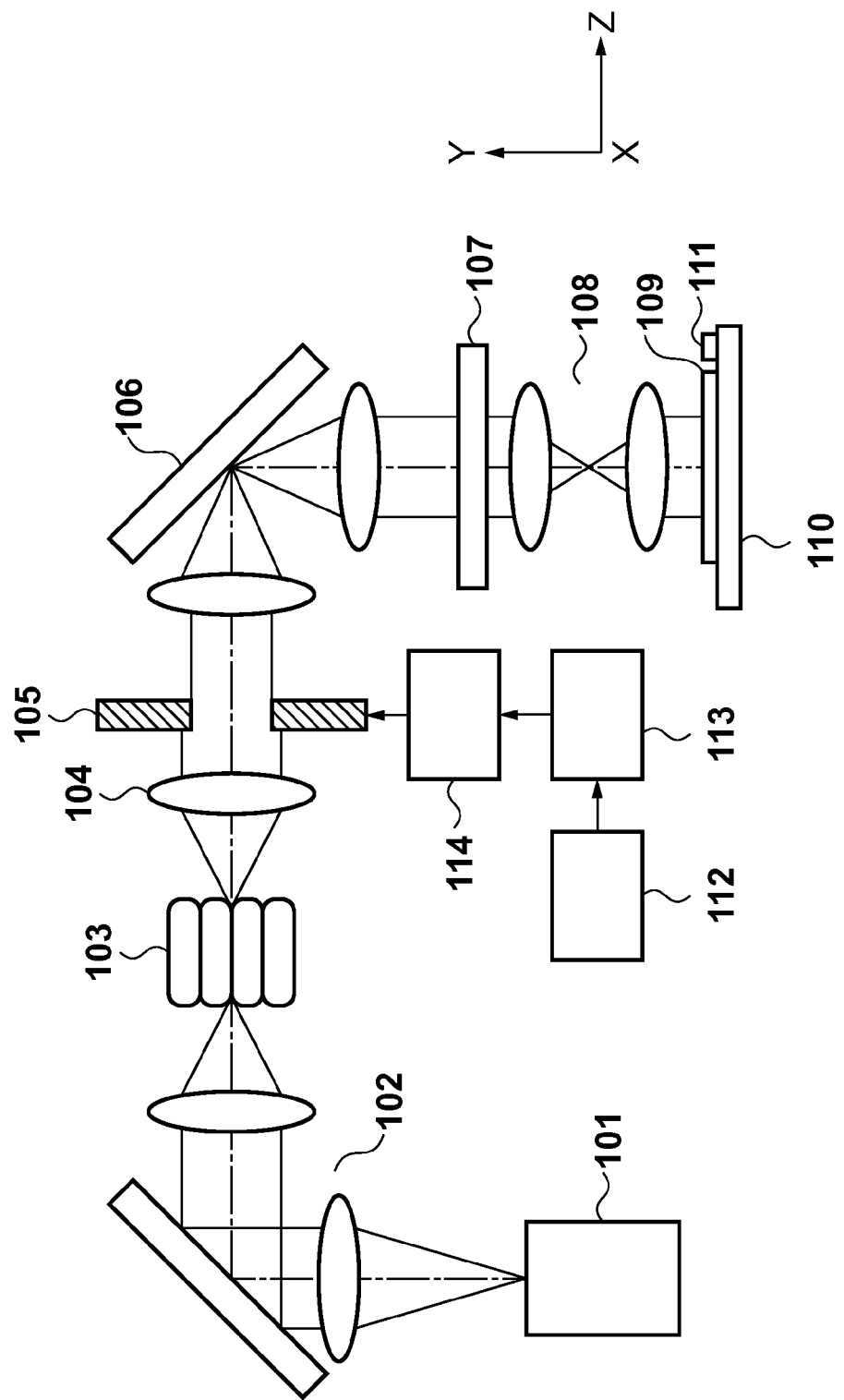
FIG. 1 is a view showing an exposure apparatus according to the first embodiment.

FIG. 1 is a view showing an exposure apparatus according to the first embodiment of the present invention. Light emitted by a light source 101 enters an integrator 103 via a shaping unit 102. The shaping unit 102 can change the shape and magnitude of light which is to enter the integrator 103. The integrator 103 has a function of making uniform the illuminance distribution of a surface to be illuminated. The light emerging from the integrator 103 illuminates an illumination field stop (stop) 105 via a condenser lens 104. The illumination field stop 105 defines the illumination range of a surface to be illuminated of a reticle 107 or wafer (substrate) 109. The illumination field stop 105 and reticle 107 have an image forming relationship via a condenser lens (imaging optical system) 106. On the reticle 107, the exposure pattern of a circuit original or the like is formed. The exposure pattern is imaged on the wafer 109 placed on a wafer stage (substrate stage) 110 via a projection optical system 108. An illuminance sensor (measurement unit) 111 for measuring an illuminance on the wafer surface is arranged on the wafer stage 110.

A setting unit 112 sets an illumination range on the reticle surface or wafer surface. A calculation unit 113 such as a computer calculates an aperture size of the illumination field stop 105 that corresponds to the illumination range set by the setting unit 112, and sends the calculation result to a driving unit 114 such as a pulse motor. The driving unit 114 drives the blades of the illumination field stop 105 to obtain the aperture size of the illumination field stop 105 that is sent from the calculation unit 113. The calculation unit 113 and driving unit 114 form an adjusting unit which adjusts the aperture size of the illumination field stop 105.

FIG. 2 shows details of the illumination field stop 105. The illumination field stop 105 includes four blades 201 to 204 which are independently driven by the driving unit 114. The blades (first blades) 202 and 204 define an aperture size of the illumination field stop 105 in the first direction (X direction) perpendicular to the optical axis direction (Z direction) of the illumination optical system. The blades (second blades) 201 and 203 define an aperture size of the illumination field stop 105 in the second direction (Y direction) perpendicular to the optical axis direction (Z direction) of the illumination optical system. Since the illumination range is restricted to a rectangular shape, all four of the blades 201 to 204 cannot be arranged on the same plane. Hence, the blades 201 and 203 and the blades 202 and 204 are arranged at different positions in the optical axis direction (Z direction). In FIG. 2, the blades 201 and 203 are arranged on the reticle side, and the blades 202 and 204 are arranged on the light source side. Alternatively, the blades 201 and 203 may be arranged on the light source side.

Figure 3:
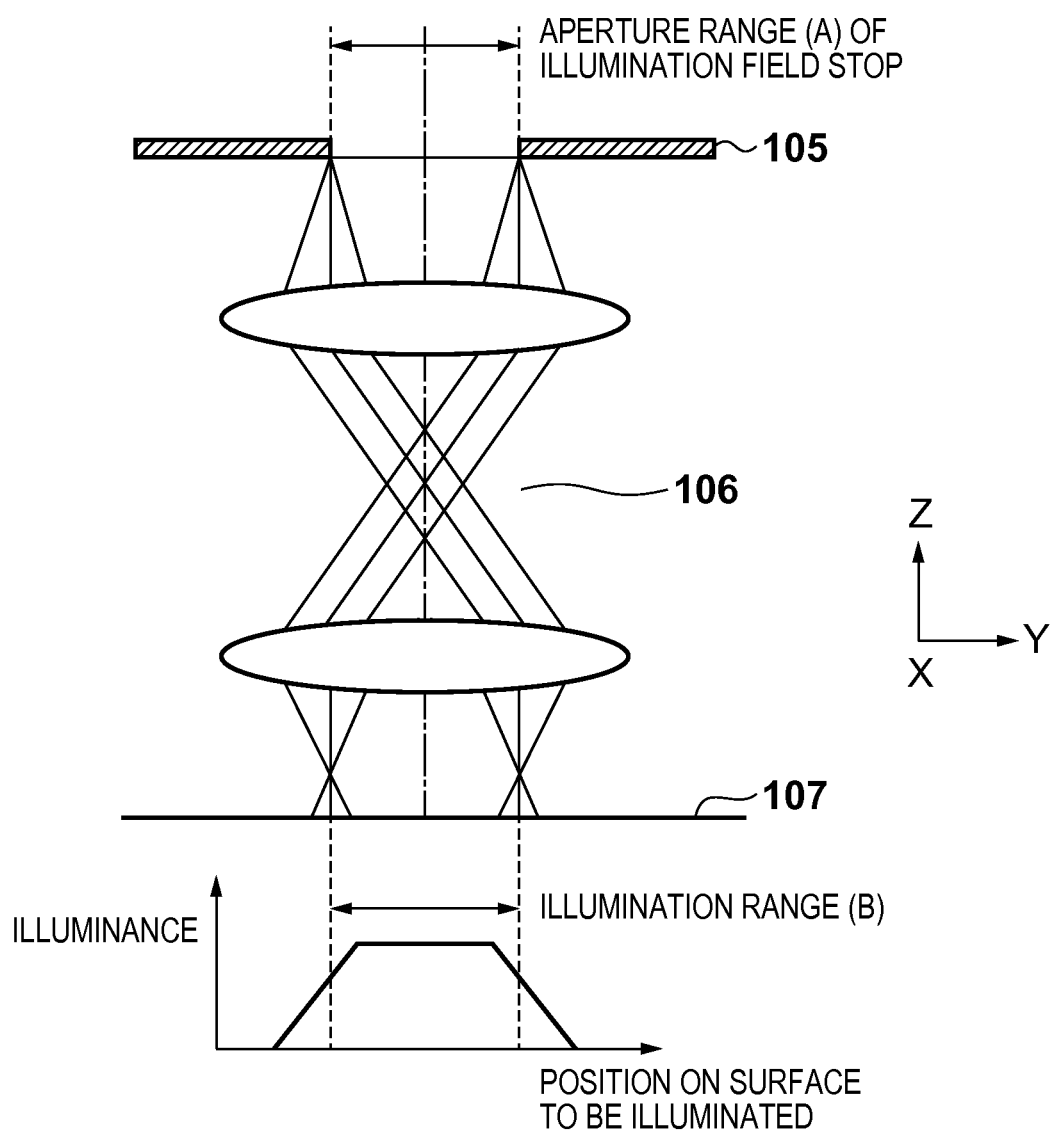
FIG. 3 is a view for explaining a problem to be solved by the present invention.

A decrease in exposure amount near a portion shielded from light by the illumination field stop 105 will be explained with reference to FIG. 3. The illumination field surface and the reticle surface or its conjugate plane have an image forming relationship via the condenser lens 106. Owing to aberration of the condenser lens 106, the image of the illumination field stop 105 blurs. For this reason, the illuminance distribution on the surface of the reticle 107 has a trapezoidal shape, as shown in FIG. 3. In FIG. 3, the aperture size of the illumination field stop 105 is set to coincide with the illumination range. Letting β be the image forming magnification of the condenser lens 106, the aperture size (A) of the illumination field stop 105=the illumination range (B)÷β. In this case, a region where the trapezoidal illuminance distribution inclines falls within the illumination range, so the illuminance becomes nonuniform and the exposure amount decreases near a portion shielded from light by the illumination field stop 105.

Figure 4:
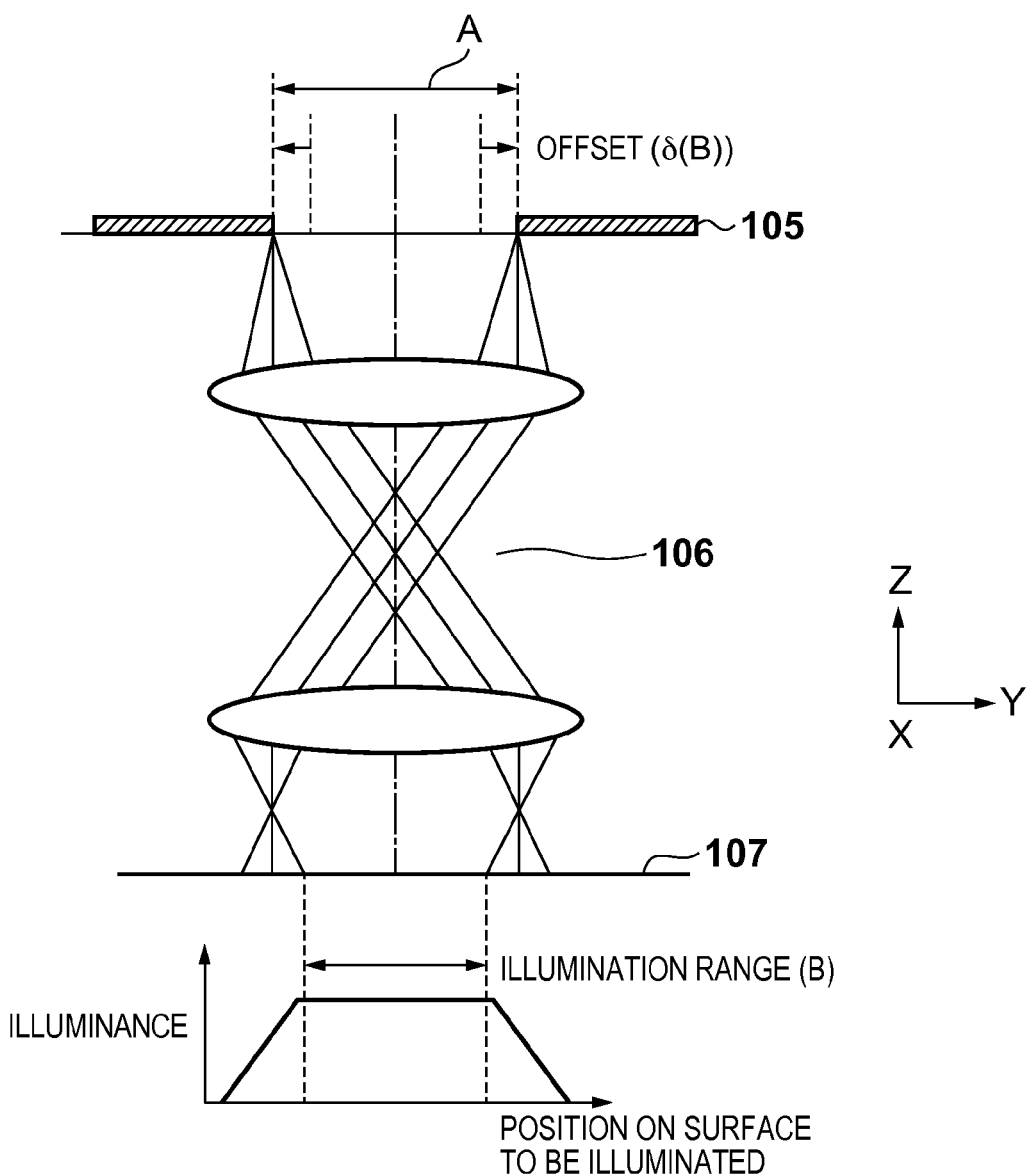
FIG. 4 is a view for explaining the effects of the present invention.

FIG. 4 shows a state in which the aperture size of the illumination field stop 105 is offset in the opening direction. By offsetting the position of the illumination field stop 105, the position of the region where the trapezoidal illuminance distribution inclines is offset, and the illuminance distribution can be made uniform in a target illumination range. In a conventional technique, the offset amount is constant regardless of the illumination range. Letting A be the aperture size of the illumination field stop 105, B be the illumination range, and δ be the offset amount, A=B÷β+δ, where δ is the constant.

However, owing to the curvature of field and distortion of the condenser lens 106, the image blur amount of the illumination field stop 105 and the image forming position of an image change depending on the image height. Strictly speaking, the optimal offset amount δ changes depending on the illumination range, so the offset amount δ is a function δ(B) using the target illumination range B as a variable. δ(B) is generally represented by a high-order expression of B. For example, when δ(B) is represented by a cubic equation, $\delta(B) = a \times B^3 + b \times B^2 + c \times B + d$. In the embodiment, the calculation unit 113 obtains in advance the values of the coefficients a, b, c, and d representing the relationship between the target illumination range B and the offset amount δ. For example, the respective coefficients are obtained by simulating the image of the illumination field stop 105 by using aberration such as the curvature of field and distortion of the condenser lens 106. The calculation unit 113 calculates the optimal offset amount δ by using the coefficients a to d and the target illumination range B set by the setting unit 112. Hence, even if the target illumination range of a surface to be illuminated is changed, the aperture size of the illumination field stop 105 can be automatically offset, and exposure can be executed without decreasing the exposure amount. In the first embodiment, the driving unit 114 adjusts the aperture size based on the relationship between the target illumination range B and the offset amount δ, and the target illumination range. However, the relationship between the aperture size and the illumination range may be used instead of the relationship between the illumination range B and the offset amount δ.

Second Embodiment

Figure 5:
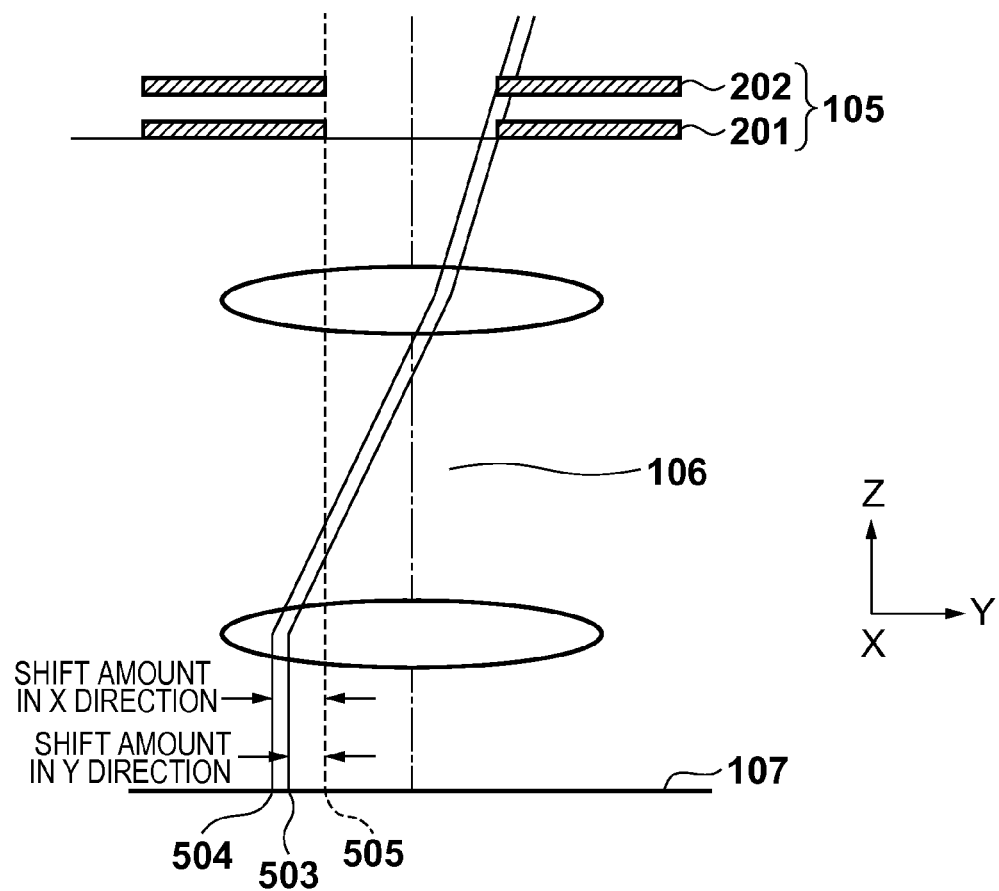
FIG. 5 is a view for explaining a problem to be solved by the second embodiment.

The second embodiment will be described with reference to FIG. 5. Rays on the object side of a condenser lens 106 may not be telecentric. That is, the principal ray of rays on the illumination field stop surface is not perpendicular but inclines. As described with reference to FIG. 2, blades 201 to 204 of an illumination field stop 105 cannot be arranged on the same plane, so the blade 202 in the X direction and the blade 201 in the Y direction are arranged at different positions in the optical axis direction (Z direction). Thus, as shown in FIG. 5, the shift amounts of an image forming position 503 of the blade 202 in the X direction and an image forming position 504 of the blade 201 in the Y direction from a target image forming position 505 do not coincide with each other owing to the influence of distortion. In other words, the optimal offset amount $\delta_x(B)$ of the blade 202 in the X direction and the optimal offset amount $\delta_y(B)$ of the blade 201 in the Y direction are different values. For illustrative convenience, the two blades 201 and 202 are illustrated as apertures in the same direction.

In the second embodiment, a calculation unit 113 stores a coefficient representing the relationship between the illumination range of the blade 202 in the X direction and the offset amount, and a coefficient representing the relationship between the illumination range of the blade 201 in the Y direction and the offset amount. The calculation unit 113 can calculate optimal offset amounts in the X and Y directions from an illumination range in the X direction and an illumination range in the Y direction which are set by a setting unit 112. As a result, a satisfactory exposure result can be obtained in an illumination optical system in which the blade 202 in the X direction and the blade 201 in the Y direction are arranged at positions shifted in the optical axis direction.

Figure 6:
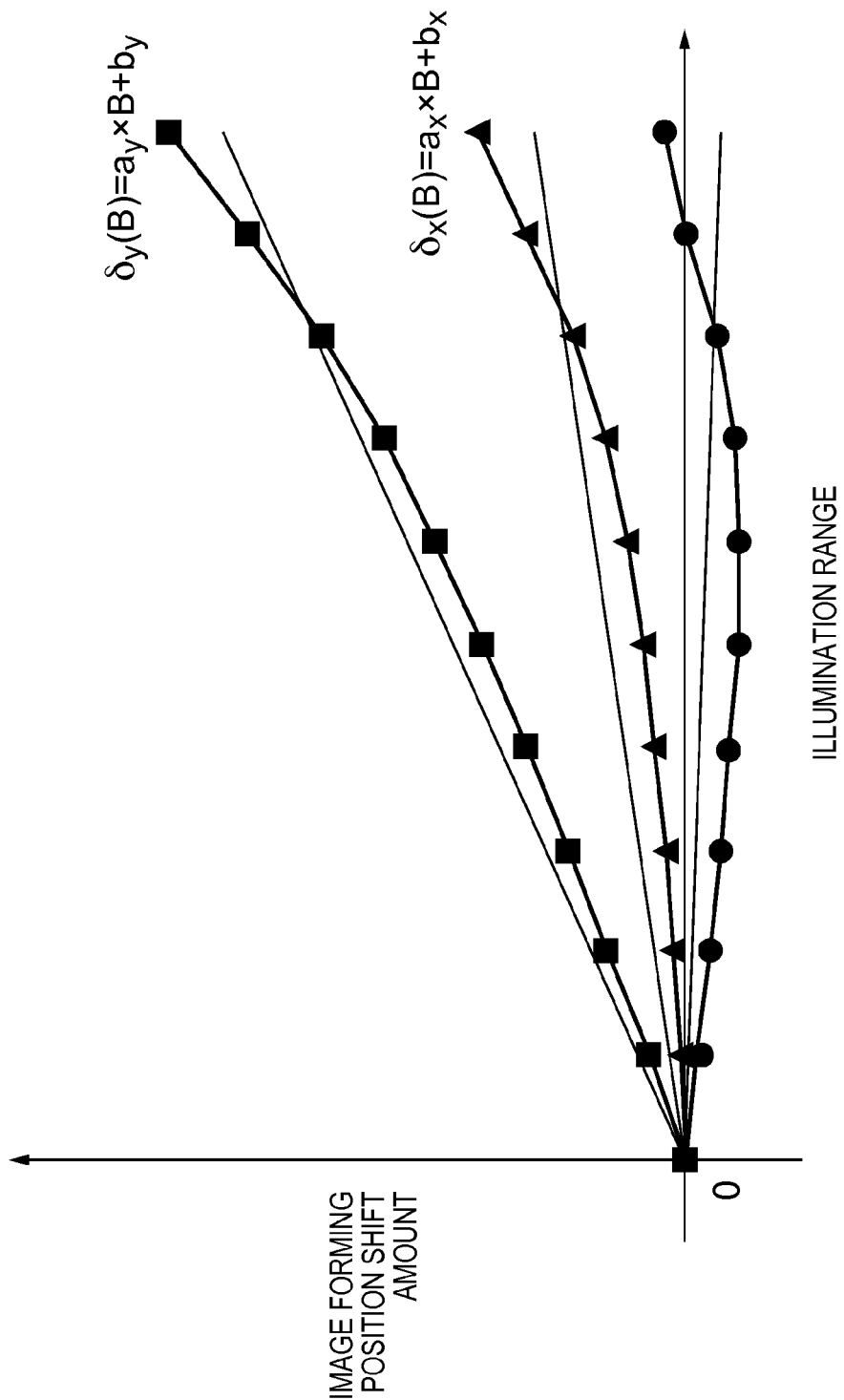
FIG. 6 is a graph showing the relationship between the illumination range and the image forming position shift amount.

FIG. 6 shows the relationship between the illumination range and the image forming position shift amount owing to aberration of a condenser lens 106. A plot of circular points represents a relationship obtained when the illumination field stop 105 is arranged at a position coincident with the wafer surface or its conjugate plane. A plot of triangular points and a plot of square points represent relationships obtained when the blade in the X direction and the blade in the Y direction are shifted by different amounts from the wafer surface or its conjugate plane. The plot of triangular points represents a relationship of the illumination field stop 105 in the X direction, and the plot of square points represents a relationship in the Y direction. In the second embodiment, the offset amount is set to compensate for a shift of the image forming position owing to aberration of the condenser lens 106. Therefore, a relationship obtained by inverting the sign of the ordinate in FIG. 6 exhibits the relationship between the illumination range and the offset amount.

In FIG. 6, the image forming position shift amount (that is, offset amount) is indicated by a straight line linearly approximated by a linear equation. As described above, the best approximation expresses the relationship between the illumination range and the offset amount by a high-order expression. In some cases, however, this relationship may be expressed by a linear approximation. To simplify a process of calculating an offset amount, the coefficient parameters of the respective terms of the offset amount δ(B) in a linear approximate expression may be stored. More specifically, the calculation unit 113 may store the values of the coefficients a and b in an expression of $\delta(B) = a \times B + b$, and calculate an offset amount from the coefficients a and b. For example, in the linear approximate expression of FIG. 6, the offset amount is calculated using $a_x$ and $b_x$ for the blade in the X direction, and $a_y$ and $b_y$ for the blade in the Y direction.

Third Embodiment

The third embodiment will be described with reference to FIG. 7. In the third embodiment, an illumination field stop 105 is movable in the optical axis direction. By changing the position (first position) of the illumination field stop 105 in the optical axis direction, the illuminance distribution of the exposure region can be changed. A plane position 601 has an image forming relationship with the wafer surface or a surface 107 to be illuminated which is conjugate to the wafer surface. When the illumination field stop 105 is arranged at the plane position 601, the illuminance distribution on the surface 107 to be illuminated becomes an almost rectangular illuminance distribution 603. When the illumination field stop 105 is arranged at a position 602 shifted in the optical axis direction from the plane position 601, the illuminance distribution on the surface 107 to be illuminated becomes a trapezoidal illuminance distribution 604.

For example, when exposure regions are connected to perform exposure, the exposure amount can be made constant by connecting inclined region portions of the trapezoidal illuminance distribution 604. To achieve this, a driving unit 114 shown in FIG. 7 changes the position (first position) of the blade in the optical axis direction in addition to the position (second position) of the blade in a direction perpendicular to the optical axis of the illumination field stop 105.

Since the position shift amount based on distortion changes depending on the position of the illumination field stop 105 in the optical axis direction, as described above, the optimal offset amount of the illumination field stop 105 changes depending on the position in the optical axis direction. Letting Z be the position in the optical axis direction, the offset amount δ is expressed by, for example, $\delta(B, Z) = a(Z) \times B^3 + b(Z) \times B^2 + c(Z) \times B + d(Z)$. From this, a calculation unit 113 which calculates the offset amount of the illumination field stop 105 in FIG. 7 calculates the optimal offset amount δ in accordance with not only the illumination range (B) but also the position (Z) of the illumination field stop 105 in the optical axis direction.

More specifically, the calculation unit 113 stores a coefficient which defines the relationship between the offset amount and the position of the illumination field stop 105 in the optical axis direction, in addition to a coefficient which defines the relationship between the offset amount and the illumination range. The calculation unit 113 can therefore calculate an optimal offset amount depending on the illumination range and the position of the illumination field stop 105 in the optical axis direction. In the third embodiment, even when the illumination field stop 105 is driven in the optical axis direction to make the exposure amount constant, the optimal offset amount of the illumination field stop 105 can be calculated to drive the illumination field stop 105, and exposure can be executed under the optimal condition.

Fourth Embodiment

A coefficient to be stored in a calculation unit 113 can be calculated from a designed value, but can also be measured in the apparatus by taking account of the tolerance and manufacturing error of the optical system. When a coefficient to be stored in the calculation unit 113 is calculated from a designed value, the calculation unit 113 forms an obtaining unit which obtains the relationship between the offset amount (or aperture size) and the illumination range when the aperture size is changed. By referring to FIGS. 8 and 9, the fourth embodiment will explain a case in which the coefficient is obtained in the apparatus based on a measurement result. FIG. 8 shows a method of obtaining a coefficient from an exposure result. In FIG. 8, 8A shows the aperture state of an illumination field stop 105, and 8B shows an exposure result on a wafer 109. In 8B, a hatched region is a region where the resist remains, and a blank region is a region where the resist is exposed and removed. A region indicated by a dotted line is a region on the wafer 109 that corresponds to the aperture region of the illumination field stop 105 in 8A. Distances indicated by arrows between the respective sides of the dotted region and the position where the resist remains exhibit an image forming position shift amount. Exposure is executed while widening the illumination field stop 105 to various aperture regions, a shift amount indicated by arrows in each state is measured, and a plot as represented by 604 in FIG. 7 can be created. By approximating the plot by an approximate expression, the coefficients of the respective terms of δ(B) can be calculated.

FIG. 9 shows a method of calculating the image forming position shift amount of the illumination field stop 105 in the exposure apparatus without performing an exposure process. In FIG. 9, 9A shows the aperture state of the illumination field stop 105, 9B shows the section of the illuminance distribution in the X direction on the wafer surface, and 9C shows the section of the illuminance distribution in the Y direction on the wafer surface. As described with reference to FIG. 1, an illuminance sensor 111 for measuring an illuminance on the wafer surface is arranged on a wafer stage 110 of the exposure apparatus. By measuring an illuminance at each position on the wafer surface while stepping the illuminance sensor 111, the illuminance distributions shown in 9B and 9C of FIG. 9 can be measured. The distances between positions where the illuminance becomes 100% in 9B and 9C of FIG. 9, and positions corresponding to the aperture of the illumination field stop 105 provide an image forming position shift amount. The illuminance is measured while widening the illumination field stop 105 to various apertures, the image forming position shift amount is measured at each aperture size, and a plot as shown in FIG. 7 can be created. By approximating the plot by an approximate expression, the coefficients of the respective terms of δ(B) can be calculated.

Figure 7:
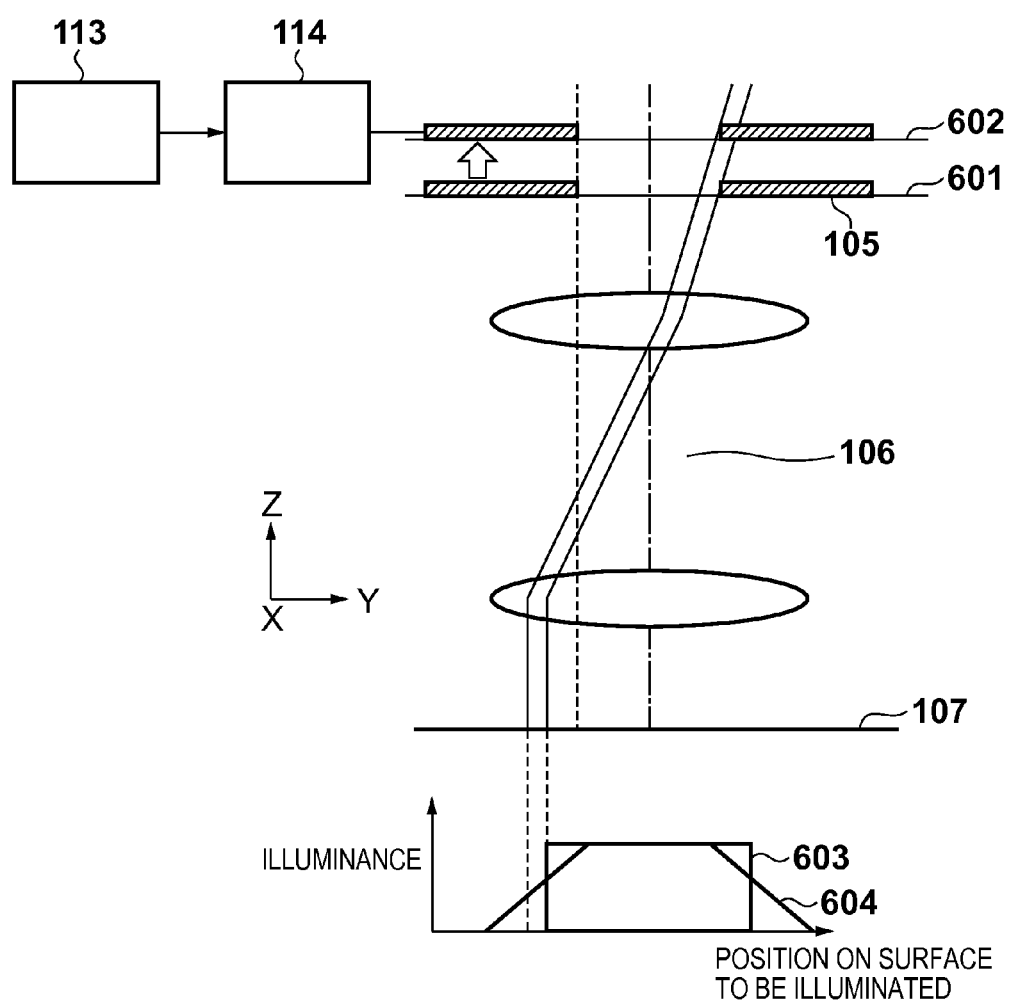
FIG. 7 is a view showing an illumination optical system according to the third embodiment.
Figure 8:
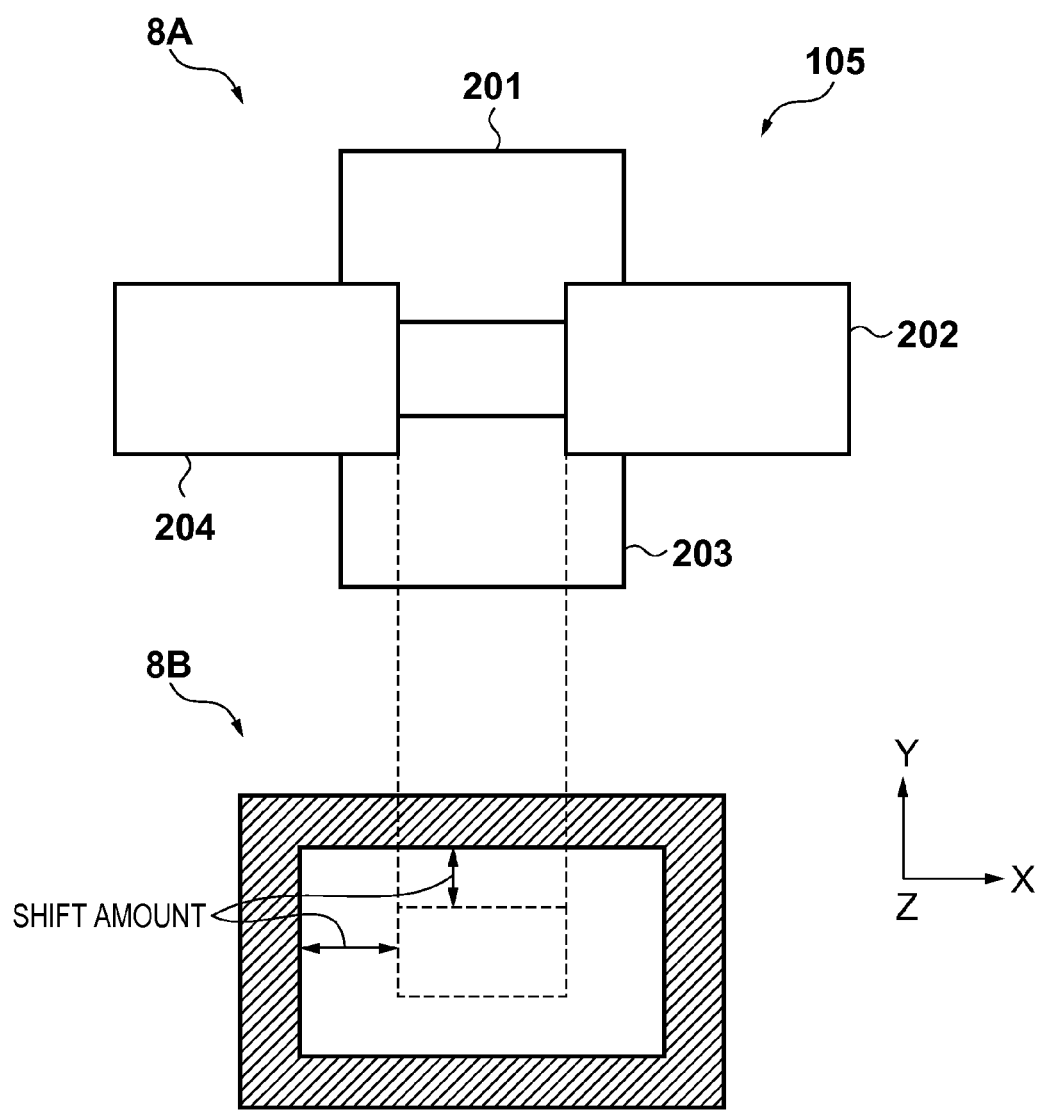
FIG. 8 is a view showing a method of obtaining an offset amount in the fourth embodiment.

If the plot in FIG. 7 can be obtained, an offset amount for an arbitrary illumination range can be calculated by, for example, linear interpolation of an offset amount in an illumination range near the arbitrary illumination range in the plot.

Method of Manufacturing Device

A method of manufacturing a device (for example, a semiconductor device or a liquid crystal display device) will be described next. A semiconductor device is manufactured by a preprocess of forming an integrated circuit on a wafer, and a post-process of completing, as a product, a chip of the integrated circuit formed on the wafer by the preprocess. The preprocess includes a step of exposing a wafer coated with a photosensitive agent to light by using the above-described exposure apparatus, and a step of developing the wafer. The post-process includes an assembly step (dicing and bonding) and packaging step (encapsulation). A liquid crystal display device is manufactured by a step of forming a transparent electrode. The step of forming a transparent electrode includes a step of coating with a photosensitive agent a glass substrate on which a transparent conductive film is deposited, a step of exposing the glass substrate coated with the photosensitive agent to light by using the above-described exposure apparatus, and a step of developing the glass substrate. The device manufacturing method according to the embodiment can manufacture a higher-quality device, compared to a conventional technique.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-086851 filed Apr. 5, 2012, which is hereby incorporated by reference herein in its entirety.

What is claimed is:

1. An illumination optical system comprising:
   a stop configured to define an illumination range of a surface to be illuminated;
   an imaging optical system configured to form an image of an aperture of the stop onto the surface to be illuminated;
   a calculation unit configured to calculate an offset amount between a size of the aperture and a target illumination range of the surface to be illuminated using data on the target illumination range of the surface to be illuminated; and
   an adjusting unit configured to adjust the size of the aperture based on the calculated offset amount,
   wherein the offset amount differs according to a size of the target illumination range of the surface to be illuminated.

2. The system according to claim 1, wherein
   the stop includes a first blade and second blade arranged at different positions in an optical axis direction of the illumination optical system, and
   the stop configures an aperture having a size defined by the second blade in a second direction perpendicular to the optical axis direction, the first blade defines a size in a first direction perpendicular to the optical axis direction, and the first direction and the second direction are different,
   the calculation unit calculates the offset amounts in the first direction and the second direction using data on the target illumination ranges of the surface to be illuminated in the first direction and the second direction, and
   the adjusting unit is configured to adjust the sizes of the aperture in the first direction and the second direction based on the calculated offset amount.

3. The system according to claim 1, wherein
   the stop includes a blade movable in an optical axis direction of the illumination optical system, and
   the stop configures an aperture having a size defined by the blade,
   the calculation unit calculates the offset amount using data on the target illumination ranges of the surface to be illuminated and data on a position of the blade in the optical axis, and
   the offset amount differs according to a size of the target illumination range of the surface to be illuminated and the position of the blade in the optical axis.

4. The system according to claim 1, further comprising a measurement unit configured to measure the illumination range of the surface to be illuminated while changing the size of the aperture,
   wherein the calculation unit calculates the offset amount using data representing a relationship between the target illumination range of the surface to be illuminated and the offset amount,
   wherein the data is obtained by using a result of measurement by the measurement unit.

5. The system according to claim 2, further comprising a measurement unit configured to measure the illumination range of the surface to be illuminated while changing the position of the first blade in the first direction and the position of the second blade in the second direction,
   wherein the calculation unit calculates the offset amount using data representing a relationship between the target illumination range of the surface to be illuminated in the first direction and the second direction and the offset amount;
   wherein the data is obtained by using a result of measurement by the measurement unit.

6. The system according to claim 3, further comprising a measurement unit configured to measure the illumination range of the surface to be illuminated while changing the position of the blade in the optical axis direction and the position of the blade in the direction perpendicular to the optical axis direction,
   wherein the calculation unit calculates the offset amount using data representing a relationship between the target illumination range of the surface to be illuminated, a position of the blade in the optical axis and the offset amount;
   wherein the data is obtained by using a result of measurement by the measurement unit.

7. The system according to claim 4, wherein the measurement unit is configured to obtain the illumination range based on an exposure result when a substrate arranged on the surface to be illuminated or a plane conjugate to the surface to be illuminated is exposed while changing the size of the aperture.

8. The system according to claim 4, wherein the measurement unit includes an illuminance sensor configured to measure an illuminance on the surface to be illuminated or a plane conjugate to the surface to be illuminated, and is configured to obtain the illumination range based on a result of measurement by the illuminance sensor that is performed while changing the size of the aperture.

9. The system according to claim 1, wherein the calculation unit calculates the offset amount using data representing a relationship between the target illumination range of the surface to be illuminated and the offset amount; and the data includes data representing by a function using a linear or high-order expression of the target illumination range.

10. The system according to claim 2, wherein an offset amount in the first direction between the size of the aperture and the target illumination range, and an offset amount in the second direction between the size of the aperture and the target illumination range are different.

11. The system according to claim 1, wherein the calculation unit calculates the offset amount using data representing a relationship between the target illumination range of the surface to be illuminated and the offset amount; and
    wherein the calculation unit configured to obtain the data by using aberration of the imaging optical system.

12. An exposure apparatus which exposes a substrate to light, wherein the apparatus is configured to project, to the substrate via a projection optical system, a pattern of an original illuminated by an illumination optical system defined in claim 1.

13. A method of manufacturing a device, the method comprising:
    exposing a substrate to light by using an exposure apparatus;
    developing the exposed substrate; and
    processing the developed substrate to manufacture the device,
    wherein the exposure apparatus is configured to project, to the substrate via a projection optical system, a pattern of an original illuminated by an illumination optical system, and the illumination optical system includes:
a stop configured to define an illumination range of a surface to be illuminated;
an imaging optical system configured to form an image of an aperture of the stop onto the surface to be illuminated;
a calculation unit configured to calculate an offset amount between a size of the aperture and a target illumination range of the surface to be illuminated using data on the target illumination range of the surface to be illuminated; and
an adjusting unit configured to adjust the size of the aperture based on the calculated offset amount,
wherein the offset amount differs according to a size of the target illumination range of the surface to be illuminated.

* * * * *